US012701801B2

(12) United States Patent
Huang

(10) Patent No.: US 12,701,801 B2
(45) Date of Patent: Aug. 4, 2026

(54) SOURCE FOLLOWER CIRCUIT

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 796 days.

(21) Appl. No.: 17/821,796

(22) Filed: Aug. 24, 2022

(65) Prior Publication Data

US 2023/0307475 A1     Sep. 28, 2023

(51) Int. Cl.
*H10F 39/00*      (2025.01)
*H03K 5/04*       (2006.01)
(52) U.S. Cl.
CPC ......... *H10F 39/80373* (2025.01); *H03K 5/04* (2013.01)
(58) Field of Classification Search
CPC ............................ H03K 5/04; H01F 39/80373
See application file for complete search history.

(56) References Cited

U.S. PATENT DOCUMENTS

| | | | |
|---|---|---|---|
| 7,019,580 B1 | 3/2006 | Michalski | |
| 7,675,273 B2 * | 3/2010 | Ko ........................... | G05F 1/575 |
| | | | 323/269 |
| 8,487,922 B2 * | 7/2013 | Brown ................. | G09G 3/3688 |
| | | | 345/94 |
| 9,231,579 B2 * | 1/2016 | Sun ......................... | H03K 17/16 |
| 9,489,988 B2 * | 11/2016 | Yamazaki ................ | G11C 5/10 |

| | | | |
|---|---|---|---|
| 10,497,454 B2 * | 12/2019 | Ma ........................... | G09G 3/20 |
| 11,417,263 B2 * | 8/2022 | Feng ..................... | G09G 3/2092 |
| 12,176,171 B2 * | 12/2024 | Liu ................... | H03K 17/08148 |
| 2003/0030617 A1 * | 2/2003 | Han ........................ | H03K 5/023 |
| | | | 345/98 |
| 2009/0237125 A1 * | 9/2009 | Zhao ........................ | H03F 3/301 |
| | | | 327/108 |
| 2011/0109350 A1 * | 5/2011 | Chaji ........................ | G09G 5/18 |
| | | | 327/108 |
| 2011/0169556 A1 * | 7/2011 | Kimura ................. | G11C 27/024 |
| | | | 327/534 |
| 2011/0273239 A1 * | 11/2011 | Lee ....................... | H03B 5/1221 |
| | | | 331/117 FE |
| 2016/0112046 A1 * | 4/2016 | Wu ................. | H03K 19/018507 |
| | | | 327/108 |
| 2017/0019095 A1 * | 1/2017 | Leong .................. | H03K 17/167 |

(Continued)

*Primary Examiner* — Menatoallah Youssef
*Assistant Examiner* — Khareem E Almo
(74) *Attorney, Agent, or Firm* — WPAT, P.C.; Anthony King

(57) ABSTRACT

The present application discloses a source follower circuit, arranged for generating output signal according to input signal. The circuit includes: a first transistor having a drain coupled to a first reference voltage; a second transistor having a drain coupled to a source of the first transistor, and the first transistor and the second transistor both have polarization of a first type; a first capacitor, wherein a terminal of the first capacitor selectively coupled to the input signal or a gate of the first transistor, another terminal of the first capacitor selectively coupled to a second reference voltage or a first bias; a second capacitor, wherein a terminal of the second capacitor selectively coupled to the input signal or a gate of the second transistor, another terminal of the second capacitor selectively coupled to a third reference voltage or a second bias.

17 Claims, 6 Drawing Sheets

500

(56) References Cited

U.S. PATENT DOCUMENTS

| | | | |
|---|---|---|---|
| 2022/0045683 A1* | 2/2022 | Inoue | H10D 30/6755 |
| 2023/0283276 A1* | 9/2023 | Ikeda | G06N 3/063 |
| | | | 327/427 |
| 2023/0307476 A1* | 9/2023 | Huang | H10F 39/80373 |

* cited by examiner

200

300

400

SOURCE FOLLOWER CIRCUIT

CROSS-REFERENCE TO RELATED APPLICATIONS

This application claims priority of Taiwan application No. 111111179 filed on Mar. 24, 2022, which is incorporated by reference in its entirety.

TECHNICAL FIELD

The present application relates to a circuit, particularly to a source follower circuit.

BACKGROUND

The input signal of a source follower is inputted from the gate of a transistor, so that the voltage of the source of the transistor will change following the input signal voltage. The source follower is often used as a driver circuit. Therefore, it is important to improve the ability of the source follower power to suppress the power supply noise in order to increase the power supply rejection ratio (PSRR), so as to improve the signal-to-noise ratio (SNR) of the source follower.

SUMMARY OF THE INVENTION

The present application provides a source follower circuit, configured to generate an output signal according to an input signal, the source follower circuit including: a first transistor, having a drain coupled to a first reference voltage; a second transistor, having a drain coupled to a source of the first transistor, and the first transistor and the second transistor both have polarization of a first type; a first capacitor, wherein one terminal of the first capacitor is selectively coupled to the input signal or a gate of the first transistor, and the other terminal of the first capacitor is selectively coupled to a second reference voltage or a first bias voltage; and a second capacitor, wherein one terminal of the second capacitor is selectively coupled to the input signal or a gate of the second transistor, the other terminal of the second capacitor is selectively coupled to a third reference voltage or a second bias voltage.

The present application provides a source follower circuit, configured to generate an output signal according to an input signal, the source follower circuit including: a first transistor, having a drain coupled to a first reference voltage; a second transistor, having a drain coupled to a source of the first transistor, and the first transistor and the second transistor both have polarization of a first type; a first capacitor, wherein one terminal of the first capacitor is coupled to a gate of the first transistor and is selectively coupled to the input signal, and the other terminal of the first capacitor is selectively coupled to a second reference voltage or a first bias voltage; a second capacitor, wherein one terminal of the second capacitor is coupled to a gate of the second transistor and selectively coupled to the input signal, and the other terminal of the second capacitor is selectively coupled to a third reference voltage or a second bias voltage.

The present disclosure is able to increase the PSRR of a source follower.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
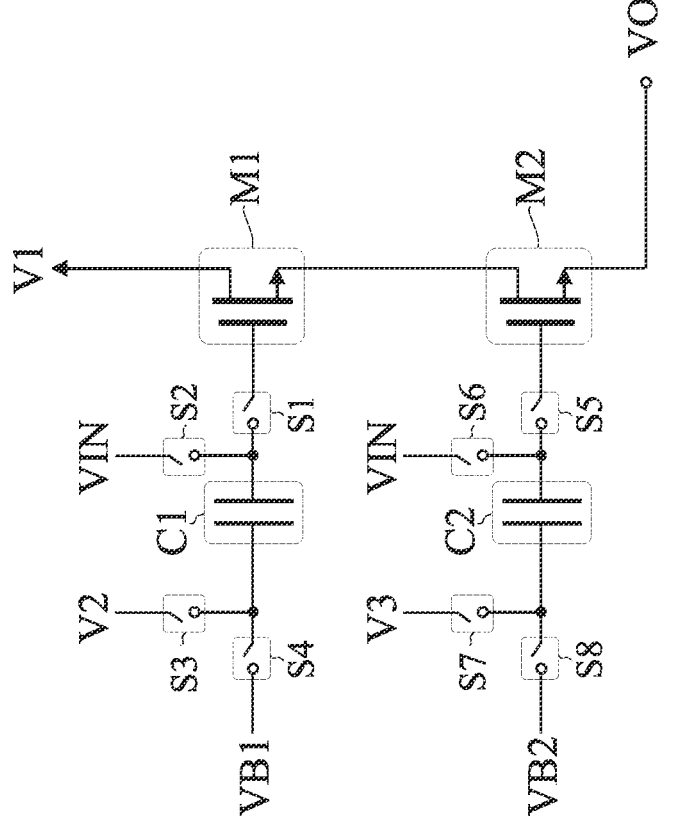
FIG. 1 is a schematic diagram of a source follower circuit according to the first embodiment of the present disclosure.

FIG. 1 is a schematic diagram of a source follower circuit according to the first embodiment of the present disclosure. The source follower circuit 100 is configured to generate an output signal VO according to an input signal VIN to drive a following load. The source follower circuit 100 includes a transistor M1, a transistor M2, a capacitor C1 and a capacitor C2. In this case, the transistor M1 and the transistor M2 are arranged in a way of cascode, such that the source of the transistor M1 is coupled to the drain of the transistor M2, and the drain of the transistor M1 is coupled to the reference voltage V1. The transistor M2 is used as the main source follower of the source follower circuit 100, and is configured to generate the output signal VO according to the input signal VIN of the gate. The transistor M1 is arranged such that the drain voltage of the transistor M2 is related to the input signal VIN; in this way, the drain-source voltage of the transistor M2 can be kept as unchanged as much as possible when the input signal VIN varies, so that the transconductance of the transistor M2 is constant as much as possible, thereby increasing the linearity of the output signal VO. Moreover, limiting the drain-source voltage of the transistor M2 can at the same time inhibit the channel length modulation effect.

One terminal of the capacitor C1 is selectively coupled to the input terminal of the input signal VIN or the gate of the transistor M1, the other terminal of the capacitor C1 is selectively coupled to the input terminal of the reference voltage V2 or the input terminal of the bias voltage VB1. One terminal of the capacitor C2 is selectively coupled to the input terminal of the input signal VIN or the gate of the transistor M2, and the other terminal of the capacitor C2 is selectively coupled to the input terminal of the reference voltage V3 or the input terminal of the bias voltage VB2.

The capacitor C1 and the switch S1, the switch S2, the switch S3 and the switch S4 form a switch capacitor circuit, configured to generate the AC voltage component of the gate of the transistor M1 according to the input signal VIN and generate the DC voltage component of the gate of the transistor M1 according to the bias voltage VB1. The capacitor C2 and the switch S5, the switch S6, the switch S7 and the switch S8 form a switch capacitor circuit, configured to generate the AC voltage component of the gate of the transistor M2 according to the input signal VIN, and generate the DC voltage component of the gate of the transistor M2 according to the bias voltage VB2.

Specifically, one terminal of the capacitor C1 is coupled to the gate of the transistor M1 via the switch S1 and coupled to the input terminal of the input signal VIN via the switch S2, and the other terminal of the capacitor C1 is coupled to the input terminal of the reference voltage V2 via the switch S3 and coupled to the input terminal of the bias voltage VB1 via the switch S4. One terminal of the capacitor C2 is coupled to the gate of the transistor M2 via the switch S5 and coupled to the input terminal of the input signal VIN via the switch S6, and the other terminal of the capacitor C2 is coupled to the input terminal of the reference voltage V3 via the switch S7 and coupled to the input terminal of the bias voltage VB2 via the switch S8. In this case, the bias voltage VB1 and the bias voltage VB2 are respectively configured to determine the DC voltages of the gate of the transistor M1 and the gate of the transistor M2, wherein the bias voltage VB1 and the bias voltage VB2 can be different. The values of the reference voltage V2 and the reference voltage V3 also affect the DC voltages of the gate of the transistor M1 and the gate of the transistor M2; in some embodiments, the reference voltage V2 and the reference voltage V3 are substantially identical. However, in alternative embodiments, the reference voltage V2 and the reference voltage V3 can be different.

When the source follower circuit 100 operates, it switches periodically between a sampling phase and a holding phase to achieve discrete-time operation. In the sampling phase, the switch S2, the switch S3, the switch S6 and the switch S7 are conducted, and the switch S1, the switch S4, the switch S5 and the switch S8 are not conducted, so that the components of the input signal VIN enter the capacitor C1 and the capacitor C2; in the holding phase, the switch S1, the switch S4, the switch S5 and the switch S8 are conducted, and the switch S2, the switch S3, the switch S6 and the switch S7 are not conducted, so that the components of the input signal VIN and the components of the bias voltage VB1 in the capacitor C1 enter the transistor M1, and so that the components of the input signal VIN and the components of the bias voltage VB2 in the capacitor C2 enter the transistor M2.

In certain embodiments, in the sampling phase, it is also possible that the switch S2, the switch S4, the switch S6 and the switch S8 are conducted, and the switch S1, the switch S3, the switch S5 and the switch S7 are not conducted, so that the components of the input signal VIN and the components of the bias voltage VB1 enter the capacitor C1, and so that the components of the input signal VIN and the components of the bias voltage VB2 enter the capacitor C2; in the holding phase, the switch S1, the switch S3, the switch S5 and the switch S7 are conducted, and the switch S2, the switch S4, the switch S6 and the switch S8 are not conducted, so that the components of the input signal VIN and the components of the bias voltage VB1 in the capacitor C1 enter the transistor M1, and so that the components of the input signal VIN and the components of the bias voltage VB2 in the capacitor C2 enter the transistor M2.

Because the function of the transistor M1 is to assist the transistor M2 (i.e., the transistor M2 is the main source follower in the source follower circuit 100), the capacitance of the capacitor C2 is greater than the capacitance of the capacitor C1, such that the gate of transistor M2 is affected by the input signal VIN more than the gate of transistor M1.

Generally, to increase the operating frequency of the source follower circuit 100, the channel aspect ratio of the transistor M1 and transistor M2 is often designed to be greater, so as to increase the current that can drive the following load quickly; in this way, the parasitic capacitor of the transistor M1 and transistor M2 is relatively greater. Therefore, when the power supply noise carried in the reference voltage V1 enters the drain of the transistor M1, the gate-drain coupling capacitor of the transistor M1 will couple the noise to the gate of the transistor M1, but the noise cannot affect the gate of the transistor M2 through the capacitor C1, and hence will not be reflected on the output voltage VO. Even if the noise can be reflected on the gate of the transistor M2 through other paths, the effect is insignificant. In other words, the present disclosure increases the PSRR and SNR of the source follower circuit 100 by ensuring that the noise cannot affect the gate of the transistor M2 through the capacitor C1.

In certain embodiments, in the sampling phase, it is also possible that the input signal VIN can also drive the gate terminal of the transistor, such that, overall, the input signal VIN can be reflected on the transistor more efficiently. Specifically, in the sampling phase, the switch S1, the switch S2, the switch S3, the switch S5, the switch S6 and the switch S7 are conducted, and the switch S4 and the switch S8 are not conducted, so that the components of the input signal VIN enter the capacitor C1 and the capacitor C2 and the transistor M1 and the transistor M2; in the holding phase, the switch S1, the switch S4, the switch S5 and the switch S8 are conducted, and the switch S2, the switch S3, the switch S6 and the switch S7 are not conducted, so that the components of the input signal VIN and the components of the bias voltage VB1 in the capacitor C1 enter the transistor M1, and so that the components of the input signal VIN and the components of the bias voltage VB2 in the capacitor C2 enter the transistor M2.

In certain embodiments, in the sampling phase, it is also possible that the switch S1, the switch S2, the switch S4, the switch S5, the switch S6 and the switch S8 are conducted, and the switch S3 and the switch S7 are not conducted, so that the components of the input signal VIN and the components of the bias voltage VB1 enter the capacitor C1, and so that the components of the input signal VIN and the components of the bias voltage VB2 enter the capacitor C2; in the holding phase, the switch S1, the switch S3, the switch S5 and the switch S7 are conducted, and the switch S2, the switch S4, the switch S6 and the switch S8 are not conducted, so that the components of the input signal VIN and the components of the bias voltage VB1 in the capacitor C1 enter the transistor M1, and so that the components of the input signal VIN and the components of the bias voltage VB2 in the capacitor C2 enter the transistor M2.

Figure 2:
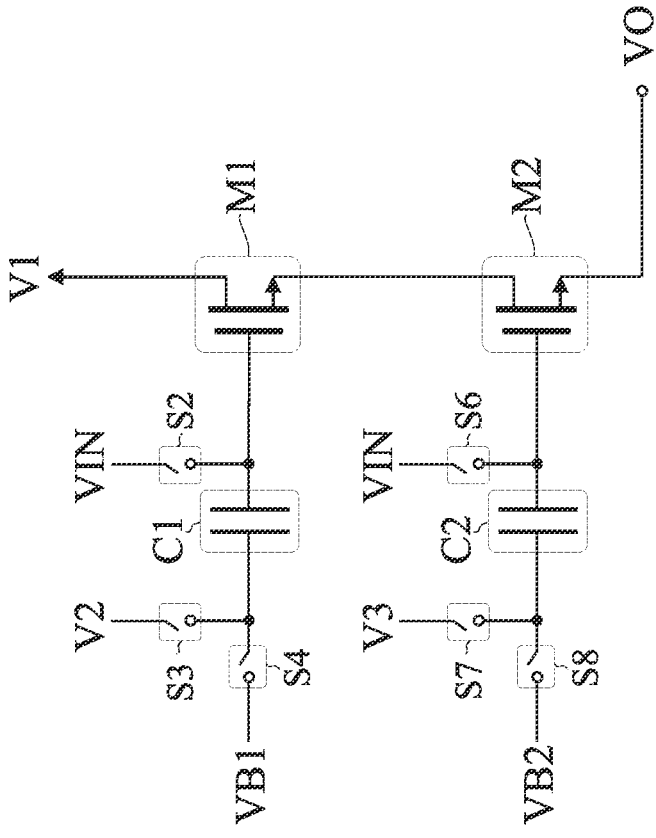
FIG. 2 is a schematic diagram of a source follower circuit according to the second embodiment of the present disclosure.

Since the switch S1 and the switch S5 remain conducted during both the sampling phase and the holding phase in the above-mentioned enhanced-driving operation, in some embodiments, it is possible to omit the switch S1 and the switch S5 in FIG. 1 and configure the source follower circuit 200 as in the embodiment of FIG. 2.

Both the embodiments of the source follower circuit 100 and the source follower circuit 200 use N-type transistors; however, the present disclosure is not limited thereto. For example, both the source follower circuit 300 of and the source follower circuit 400 use P-type transistors.

The source follower circuit 300 includes a transistor M3, a transistor M4, a capacitor C3 and a capacitor C4. In this case, the transistor M3 and the transistor M4 are arranged in a cascade, such that the source of the transistor M3 is coupled to the drain of the transistor M4, and the drain of the transistor M3 is coupled to the reference voltage V4. The transistor M4 is used as the main source follower in the source follower circuit 300 and is configured to generate the output signal VO according to the gate of the input signal VIN. The transistor M3 is arranged such that the drain voltage of the transistor M4 can be related to the input signal VIN.

One terminal of the capacitor C3 is selectively coupled to the input signal VIN or the gate of the transistor M3, the other terminal of the capacitor C3 is selectively coupled to the reference voltage V5 or the bias voltage VB3. One terminal of the capacitor C4 is selectively coupled to the input signal VIN or the gate of the transistor M4, the other terminal of the capacitor C4 is selectively coupled to the reference voltage V6 or the bias voltage VB4.

The capacitor C3, the switch S9, the switch S10, the switch S11 and the switch S12 form a switch capacitor circuit, which is configured to generate the AC voltage component of the gate of the transistor M3 according to the input signal VIN, and generate the DC voltage component of the gate of the transistor M3 according to the bias voltage VB3. The capacitor C4, the switch S13, the switch S14, the switch S15 and the switch S16 for a switch capacitor circuit, which is configured to generate the AC voltage component of the gate of the transistor M4 according to the input signal VIN, and generate the DC voltage component of the gate of the transistor M4 according to the bias voltage VB4.

Specifically, one terminal of the capacitor C3 is coupled to the gate of the transistor M3 via the switch S9 and coupled to the input terminal of the input signal VIN via the switch S10, and the other terminal of the capacitor C3 is coupled to the input terminal of the reference voltage V5 via the switch S11 and coupled to the input terminal of the bias voltage VB3 via the switch S12. One terminal of the capacitor C4 is coupled to the gate of the transistor M4 via the switch S13 and coupled to the input terminal of the input signal VIN via the switch S14, and the other terminal of the capacitor C4 is coupled to the input terminal of the reference voltage V6 via the switch S15 and coupled to the input terminal of the bias voltage VB4 via the switch S16. In this case, the bias voltage VB3 and the bias voltage VB4 are respectively configured to determine the DC voltages of the gate of the transistor M3 and the gate of the transistor M4, wherein the bias voltage VB3 and the bias voltage VB4 can be different. The values of the reference voltage V5 and the reference voltage V6 also affect the DC voltages of the gate of the transistor M3 and the gate of the transistor M4; in some embodiments, the reference voltage V5 and the reference voltage V6 are substantially identical. However, in alternative embodiments, the reference voltage V52 and the reference voltage V6 can be different.

When the source follower circuit 300 operates, it switches periodically between a sampling phase and a holding phase to achieve discrete-time operation. In the sampling phase, the switch S10, the switch S11, the switch S14 and the switch S15 are conducted, and the switch S9, the switch S12, the switch S13 and the switch S16 are not conducted, so that the components of the input signal VIN enter the capacitor C3 and the capacitor C4; in the holding phase, the switch S9, the switch S12, the switch S13 and the switch S16 are conducted, and the switch S10, the switch S11, the switch S14 and the switch S15 are not conducted, so that the components of the input signal VIN and the components of the bias voltage VB3 in the capacitor C3 enter the transistor M3, and so that the components of the input signal VIN and the components of the bias voltage VB4 in the capacitor C4 enter the transistor M4.

In certain embodiments, in the sampling phase, it is also possible that the switch S10, the switch S12, the switch S14 and the switch S16 are conducted, and the switch S9, the switch S11, the switch S13 and the switch S15 are not conducted, so that the components of the input signal VIN and the components of the bias voltage VB3 enter the capacitor C3, and so that the components of the input signal VIN and the components of the bias voltage VB4 enter the capacitor C4; in the holding phase, the switch S9, the switch S11, the switch S13 and the switch S15 are conducted, and the switch S10, the switch S12, the switch S14 and the switch S16 are not conducted, so that the components of the input signal VIN and the components of the bias voltage VB3 in the capacitor C3 enter the transistor M3, and so that the components of the input signal VIN and the components of the bias voltage VB4 in the capacitor C4 enter the transistor M4.

Because the function of the transistor M3 is to assist the transistor M4 (i.e., the transistor M4 is the main source follower in the source follower circuit 300), the capacitance of the capacitor C4 is greater than the capacitance of the capacitor C3, such that the gate of transistor M4 is more affected by the input signal VIN than the gate of transistor M3.

Similarly, in the source follower circuit 300 and the source follower circuit 400, the noise of reference voltage V4 cannot affect the gate of the transistor M4 through the capacitor C3, and hence, the PSRR and SNR can be increased.

In certain embodiments, in the sampling phase, it is also possible that the input signal VIN can also drive the gate terminal of the transistor, such that, overall, the input signal VIN can be reflected on the transistor more efficiently. Specifically, in the sampling phase, the switch S9, the switch S10, the switch S11, the switch S13, the switch S14 and the switch S15 are conducted, and the switch S12 and the switch S16 are not conducted, so that the components of the input signal VIN enter the capacitor C3 and the capacitor C4 and the transistor M3 and the transistor M4; in the holding phase, the switch S9, the switch S12, the switch S13 and the switch S16 are conducted, and the switch S10, the switch S11, the switch S14 and the switch S15 are not conducted, so that the components of the input signal VIN and the components of the bias voltage VB3 in the capacitor C3 enter the transistor M3, and so that the components of the input signal VIN and the components of the bias voltage VB4 in the capacitor C4 enter the transistor M4.

In certain embodiments, in the sampling phase, it is also possible that the switch S9, the switch S10, the switch S12, the switch S13, the switch S14 and the switch S16 are conducted, and the switch S11 and the switch S15 are not conducted, so that the components of the input signal VIN and components of the bias voltage VB3 enter the capacitor C3 and so that the components of the input signal VIN and the components of the bias voltage VB4 enter the capacitor C4; in the holding phase, the switch S9, the switch S11, the switch S13 and the switch S15 are conducted, and the switch S10, the switch S12, the switch S14 and the switch S16 are not conducted, so that the components of the input signal VIN and the components of the bias voltage VB3 in the capacitor C3 enter the transistor M3, and so that the components of the input signal VIN and the components of the bias voltage VB4 in the capacitor C4 enter the transistor M4.

Figure 3:
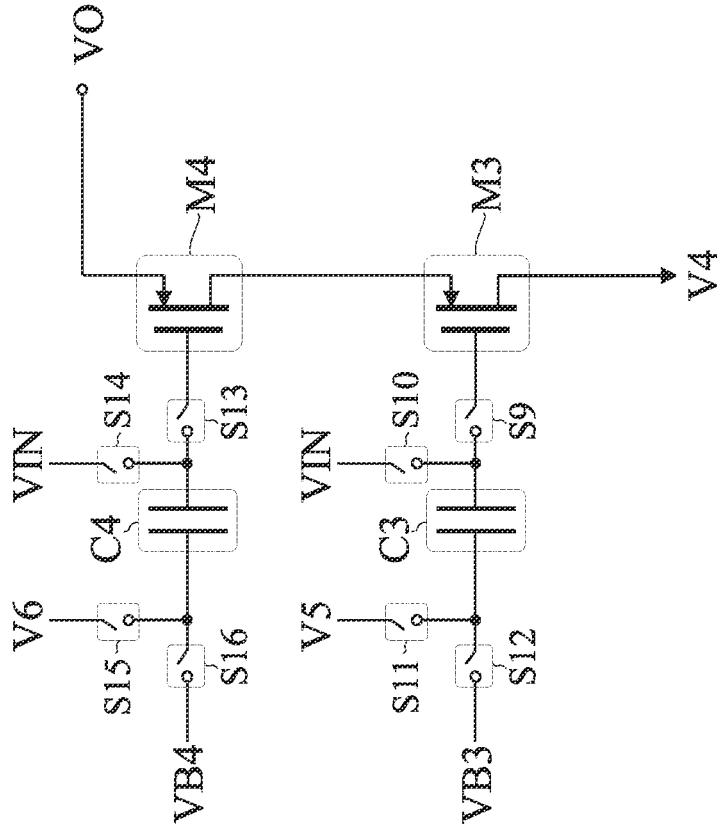
FIG. 3 is a schematic diagram of a source follower circuit according to the third embodiment of the present disclosure.
Figure 4:
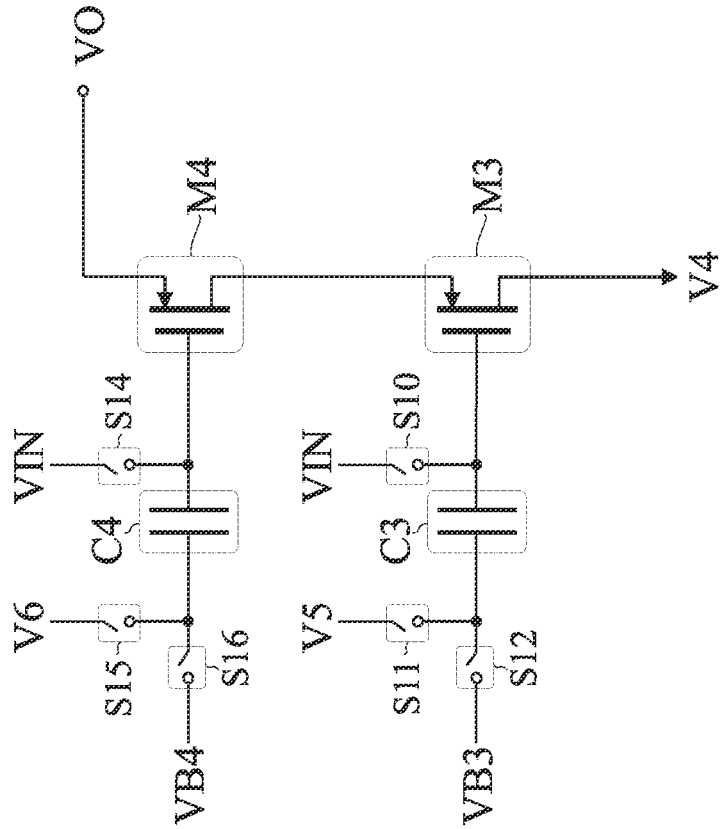
FIG. 4 is a schematic diagram of a source follower circuit according to the fourth embodiment of the present disclosure.

Since the switch S9 and the switch S13 remain conducted during both the sampling phase and the holding phase in the above-mentioned enhanced-driving operation, in some embodiments, it is possible to omit the switch S9 and the switch S13 in FIG. 3 and configure the source follower circuit 400 as in the embodiment of FIG. 4.

In certain embodiments, the source follower circuits 100/200 can be combined with the source follower circuits

Figure 5:
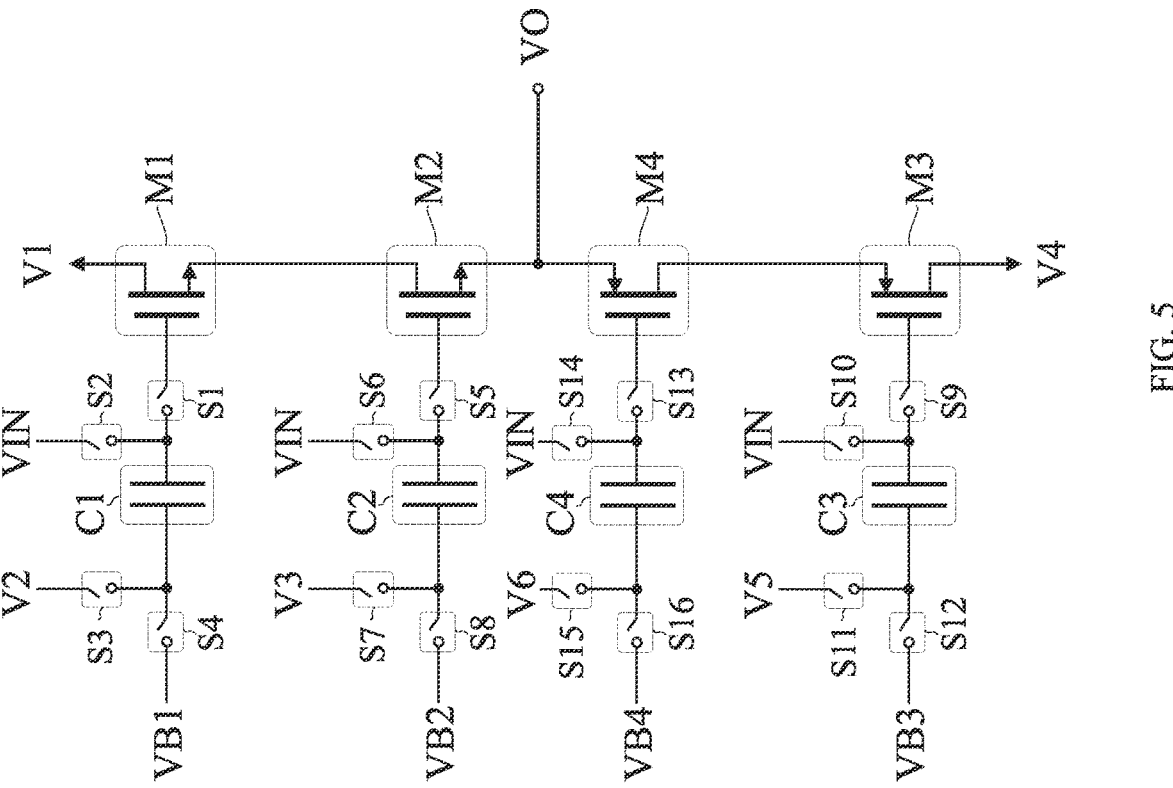
FIG. 5 is a schematic diagram of a source follower circuit according to the fifth embodiment of the present disclosure.
Figure 6:
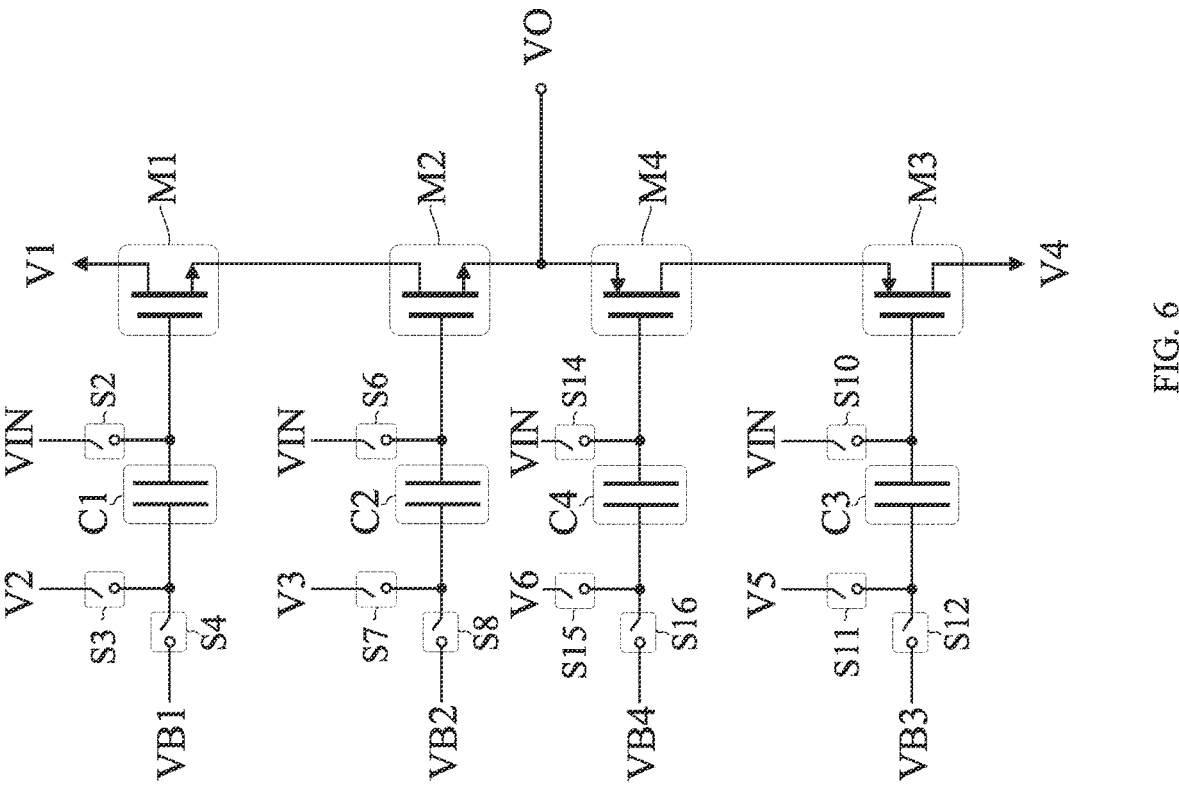
FIG. 6 is a schematic diagram of a source follower circuit according to the sixth embodiment of the present disclosure.

300/400. For example, the source follower circuit 100 is combined with the source follower circuit 300 to obtain the source follower circuit 500 of FIG. 5; the source follower circuit 200 is combined with the source follower circuit 400 to obtain the source follower circuit 600 of FIG. 6. In these embodiments, the bias voltages VB1, VB2, VB3, VB4 can be identical or different in response to the value of the input signal VIN and the values of the output signal VO is different from the critical voltages of the transistor M1, the transistor M2, the transistor M3 and the transistor M4. The reference voltage V2, the reference voltage V3, the reference voltage V5 and the reference voltage V6 can be identical or different.

What is claimed is:

1. A source follower circuit, configured to generate an output signal according to an input signal, the source follower circuit comprising:

a first transistor, having a drain coupled to a first reference voltage;

a second transistor, having a drain coupled to a source of the first transistor, and the first transistor and the second transistor both have polarization of a first type;

a first capacitor, comprising:

a first terminal, configured to receive the input signal and being disconnected from a gate of the first transistor in a sampling phase, and configured to stop receiving the input signal and being coupled to the gate of the first transistor in a holding phase; and a second terminal, configured to receive one of a second reference voltage or a first bias voltage in the sampling phase, and configured to receive another of the second reference voltage or the first bias voltage in the holding phase; and a second capacitor, comprising:

a first terminal, configured to receive the input signal and being disconnected from a gate of the second transistor in the sampling phase, and configured to stop receiving the input signal and being coupled to the gate of the second transistor in the holding phase; and a second terminal, configured to receive one of a third reference voltage or a second bias voltage in the sampling phase, and configured to receive another of the third reference voltage or the second bias voltage in the holding phase.

2. The source follower circuit of claim 1, wherein a capacitance of the second capacitor is greater than a capacitance of the first capacitor.

3. The source follower circuit of claim 1, further comprising:

a third transistor, having a drain coupled to a fourth reference voltage;

a fourth transistor, having a drain coupled to a source of the third transistor, and the third transistor and the fourth transistor both have polarization of a second type different from the first type;

a third capacitor, comprising:

a first terminal, configured to receive the input signal and being disconnected from a gate of the third transistor in the sampling phase, and configured to stop receiving the input signal and being coupled to the gate of the third transistor in the holding phase; and a second terminal, configured to receive one of a fifth reference voltage or a third bias voltage in the sampling phase, and configured to receive another of the fifth reference voltage or the third bias voltage in the holding phase; and a fourth capacitor, comprising:

a first terminal, configured to receive the input signal and being disconnected from a gate of the fourth transistor in the sampling phase, and configured to stop receiving the input signal and being coupled to the gate of the fourth transistor in the holding phase; and a second terminal, configured to receive one of a sixth reference voltage or a fourth bias voltage in the sampling phase, and configured to receive another of the sixth reference voltage or the fourth bias voltage in the holding phase.

4. The source follower circuit of claim 3, wherein:

the first terminal of the third capacitor is coupled to the gate of the third transistor via a ninth switch and coupled to the input signal via a tenth switch, and the second terminal of the third capacitor is coupled to the fifth reference voltage via an eleventh switch and coupled to the third bias voltage via a twelfth switch; and a first terminal of the fourth capacitor is coupled to the gate of the fourth transistor via a thirteenth switch and coupled to the input signal via a fourteenth switch, and the second terminal of the fourth capacitor is coupled to the sixth reference voltage via a fifteenth switch and coupled to the fourth bias voltage via a sixteenth switch.

5. The source follower circuit of claim 4, wherein when the ninth switch, the twelfth switch, the thirteenth switch and the sixteenth switch are conducted, the tenth switch, the eleventh switch, the fourteenth switch and the fifteenth switch are not conducted; and when the tenth switch, the eleventh switch, the fourteenth switch and the fifteenth switch are conducted, the ninth switch, the twelfth switch, the thirteenth switch and the sixteenth switch are not conducted.

6. The source follower circuit of claim 4, wherein when the ninth switch, the eleventh switch, the thirteenth switch and the fifteenth switch are conducted, the tenth switch, the twelfth switch, the fourteenth switch and the sixteenth switch are not conducted; and when the tenth switch, the twelfth switch, the fourteenth switch and the sixteenth switch are conducted, the ninth switch, the eleventh switch, the thirteenth switch and the fifteenth switch are not conducted.

7. The source follower circuit of claim 3, wherein a capacitance of the fourth capacitor is greater than a capacitance of the third capacitor.

8. A source follower circuit, configured to generate an output signal according to an input signal, the source follower circuit comprising:

a first transistor, having a drain coupled to a first reference voltage;

a second transistor, having a drain coupled to a source of the first transistor, and the first transistor and the second transistor both have polarization of a first type;

a first capacitor, wherein a first terminal of the first capacitor is coupled to a gate of the first transistor and receives the input signal in a sampling phase, and a second terminal of the first capacitor receives one of a second reference voltage or a first bias voltage in the sampling phase and receives another of the second reference voltage or the first bias voltage in a holding phase; and a second capacitor, wherein a first terminal of the second capacitor is coupled to a gate of the second transistor and receives the input signal in the sampling phase, and a second terminal of the second capacitor receives one of a third reference voltage or a second bias voltage in the sampling phase and receives another of the third reference voltage or the second bias voltage in the holding phase, wherein:

the first terminal of the first capacitor is coupled to the input signal via a second switch, and the second terminal of the first capacitor is coupled to the second reference voltage via a third switch and coupled to the first bias voltage via a fourth switch; and the first terminal of the second capacitor is coupled to the input signal via a sixth switch, and the second terminal of the second capacitor is coupled to the third reference voltage via a seventh switch and coupled to the second bias voltage via an eighth switch, wherein when the fourth switch and the eighth switch are conducted, the second switch, the third switch, the sixth switch and the seventh switch are not conducted; and when the second switch, the third switch, the sixth switch and the seventh switch are conducted, the fourth switch and the eighth switch are not conducted.

9. The source follower circuit of claim 8, wherein a capacitance of the second capacitor is greater than a capacitance of the first capacitor.

10. The source follower circuit of claim 8, further comprising:

a third transistor, having a drain coupled to a fourth reference voltage;

a fourth transistor, having a drain coupled to a source of the third transistor, and the third transistor and the fourth transistor both have polarization of a second type different from the first type;

a third capacitor, wherein a first terminal of the third capacitor is coupled to a gate of the third transistor and receives the input signal in the sampling phase, and the second terminal of the third capacitor receives one of a fifth reference voltage or a third bias voltage in the sampling phase and receives another of the fifth reference voltage or the third bias voltage in the holding phase; and a fourth capacitor, wherein a first terminal of the fourth capacitor is coupled to a gate of the fourth transistor and receives the input signal in the sampling phase, and the second terminal of the fourth capacitor receives one of a sixth reference voltage or a fourth bias voltage in the sampling phase and receives another of the sixth reference voltage or the fourth bias voltage in the holding phase.

11. The source follower circuit of claim 10, wherein:

the first terminal of the third capacitor is coupled to the input signal via a tenth switch, and the second terminal of the third capacitor is coupled to the fifth reference voltage via an eleventh switch and coupled to the third bias voltage via a twelfth switch; and the first terminal of the fourth capacitor is coupled to the input signal via a fourteenth switch, and the second terminal of the fourth capacitor is coupled to the sixth reference voltage via a fifteenth switch and coupled to the fourth bias voltage via a sixteenth switch.

12. The source follower circuit of claim 11, wherein when the twelfth switch and the sixteenth switch are conducted, the tenth switch, the eleventh switch, the fourteenth switch and the fifteenth switch are not conducted; and when the tenth switch, the eleventh switch, the fourteenth switch and the fifteenth switch are conducted, the twelfth switch and the sixteenth switch are not conducted.

13. The source follower circuit of claim 11, wherein when the eleventh switch and the fifteenth switch are conducted, the tenth switch, the twelfth switch, the fourteenth switch and the sixteenth switch are not conducted; and when the tenth switch, the twelfth switch, the fourteenth switch and the sixteenth switch are conducted, the eleventh switch and the fifteenth switch are not conducted.

14. The source follower circuit of claim 10, wherein a capacitance of the fourth capacitor is greater than a capacitance of the third capacitor.

15. A source follower circuit, configured to generate an output signal according to an input signal, the source follower circuit comprising:

a first transistor, having a drain coupled to a first reference voltage;

a second transistor, having a drain coupled to a source of the first transistor, and the first transistor and the second transistor both have polarization of a first type;

a first capacitor, wherein one terminal of the first capacitor is selectively coupled to the input signal or a gate of the first transistor by being coupled to the gate of the first transistor via a first switch and coupled to the input signal via a second switch, and the other terminal of the first capacitor is selectively coupled to a second reference voltage or a first bias voltage by being coupled to the second reference voltage via a third switch and coupled to the first bias voltage via a fourth switch; and a second capacitor, wherein one terminal of the second capacitor is selectively coupled to the input signal or a gate of the second transistor by being coupled to the gate of the second transistor via a fifth switch and coupled to the input signal via a sixth switch, the other terminal of the second capacitor is selectively coupled to a third reference voltage or a second bias voltage by being coupled to the third reference voltage via a seventh switch and coupled to the second bias voltage via an eighth switch.

16. The source follower circuit of claim 15, wherein when the first switch, the fourth switch, the fifth switch and the eighth switch are conducted, the second switch, the third switch, the sixth switch and the seventh switch are not conducted; and when the second switch, the third switch, the sixth switch and the seventh switch are conducted, the first switch, the fourth switch, the fifth switch and the eighth switch are not conducted.

17. The source follower circuit of claim 15, wherein when the first switch, the third switch, the fifth switch and the seventh switch are conducted, the second switch, the fourth switch, the sixth switch and the eighth switch are not conducted; and when the second switch, the fourth switch, the sixth switch and the eighth switch are conducted, the first switch, the third switch, the fifth switch and the seventh switch are not conducted.

* * * * *